Sept. 2, 1969 J. R. SILVA ET AL 3,465,276

NEGATIVE FEEDBACK CIRCUIT EMPLOYING COMBINATION AMPLIFIER AND LEAD-LAG COMPENSATION NETWORK

Filed Sept. 6, 1967

INVENTORS
JOHN R. SILVA
QUENTIN C. TURTLE

BY Dodge and Sons

ATTORNEYS

United States Patent Office 3,465,276
Patented Sept. 2, 1969

3,465,276

NEGATIVE FEEDBACK CIRCUIT EMPLOYING COMBINATION AMPLIFIER AND LEAD-LAG COMPENSATION NETWORK

John R. Silva, Rehoboth, Mass., and Quentin C. Turtle, Cranston, R.I., assignors to General Signal Corporation, a corporation of New York Filed Sept. 6, 1967, Ser. No. 665,886
Int. Cl. G06g 7/12
U.S. Cl. 328—142 5 Claims

ABSTRACT OF THE DISCLOSURE

Negative feedback electrical control circuits employing a unit which performs both amplifying and lead-lag compensation functions. The unit consists of an operational amplifier having a pair of gain resistors which are sized to insure nonlinear operation of the amplifier, and which are associated with shunt capacitors sized to afford the phase margin required for stability. In one embodiment, one capacitor shunts only a portion of the feedback resistor, and the other capacitor shunts the balance of this resistor as well as the input resistor. In another embodiment, a potentiometer is used to feed a varying portion of the output voltage to the minor feedback path of the operational amplifier.

BACKGROUND AND SUMMARY OF THE INVENTION

This invention relates to closed loop electrical control circuits employing negative feedback, and is particularly concerned with lead-lag compensation schemes for use in those circuits.

Circuits of this kind have many uses in both electronic and electro-mechanical systems. A typical use is in an industrial process controller wherein the circuit output element is an electric motor which positions a valve that regulates the flow rate of a fluid. In this particular environment, as well as many others, a small deadband and fast response are essential requirements. This necessarily means that the circuit must afford high gain amplification, and that stability problems are acute. The major cause of instability is the time or phase lag between the input to and the output from the system, and this in turn is attributable to electrical or mechanical inertia, or both, depending upon the type of system being used. If this lag becomes too great, the input and feedback signals approach an in phase condition, and the system becomes inherently unstable. As is known in the art, lead-lag compensation techniques are employed to alter the net system characteristics so as to provide a phase difference sufficiently close to 180° to insure system stability.

In some prior circuits, common components have been used to perform both the lead-lag compensation and the gain functions, but, as far as we are aware, this practice has been confined to low gain circuits using linear amplifiers. In the higher gain circuits, which use nonlinear amplifiers, compensation has been effected by a separate network. Here, a conventional practice is to use a combined linear amplifier and compensation scheme to effect the required phase shift and limited amplification of the error signal, and a second, nonlinear amplifier for final preamplification. Since this technique requires two stages of preamplification, it is expensive.

The object of this invention is to provide a relatively simple and inexpensive control circuit in which high gain amplification and lead-lag compensation are effected by a single amplification stage. The circuit is characterized by an operational amplifier provided with a minor feedback path containing a first R-C network, and with a negative input connection containing a second such network. The resistors in the two networks are sized to afford a gain high enough to insure that the operational amplifier operates in the saturating or nonlinear mode, and the two capacitors are sized to insure a phase margin sufficient to guarantee stable operation. The new circuit requires a minimum of components, and, since it effects signal amplification in a single stage using components common to the lead-lag compensation scheme, it obviously is more economical than the high gain circuits of prior art.

DESCRIPTION OF PREFERRED EMBODIMENTS

Several embodiments of the invention are described herein with reference to the accompanying drawing in which.

Figure 1:
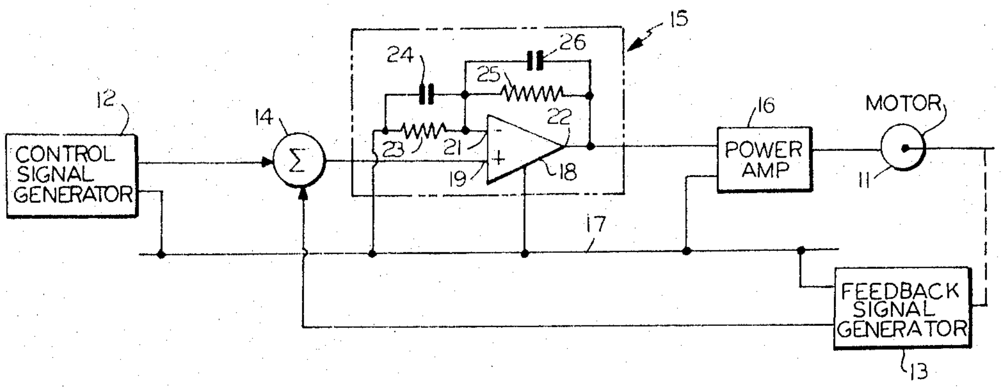
FIG. 1 is a schematic diagram illustrating a typical use of the improved circuit and showing one form of the lead-lag network.

As shown in FIG. 1, the improved circuit is used in a system for controlling an electric motor 11 which positions a device (not shown), such as a flow-regulating valve. The circuit includes control and positional feedback signal generators 12 and 13, respectively, a summation network 14 which combines these signals to produce the actuating error signal, a combination preamplifying and compensating unit 15, and a power amplifier 16. The return side of the circuit is defined by a common bus 17. The power supply portions of the circuit are not shown since they are not essential to an understanding of the invention.

Unit 15 comprises an operational amplifier 18, such as the Model PP55AU amplifier marketed by Philbrick Researchers, Inc. of Dedham, Massachusetts, which includes positive and negative inputs 19 and 21 which are connected, respectively, with network 14 and bus 17, and an output 22 which is connected with power amplifier 16. Interposed in the negative input connection is an R-C timing couple including resistor 23 and capacitor 24, and a second such couple, composed of resistor 25 and capacitor 26, is connected between output 22 and negative input 21. The last mentioned R-C couple defines a minor feedback path for the operational amplifier.

The steady state gain of the operational amplifier depends directly upon the ratio of the values of resistors 25 and 23, and these components are so sized that the amplifier is saturated, i.e., operates in the nonlinear mode. In a typical case, the gain is between 100 and 500, and the amplifier saturates when the magnitude of the error signal supplied by network 14 is about 1% of its maximum value. Once the values of resistors 23 and 25 have been established, the values of capacitors 24 and 26 are chosen to give a phase margin adequate to insure stability under the expected operating conditions of the circuit.

It should be noted that while the manufacturers of operational amplifiers usually recommend inclusion of a shunt capacitor in the minor feedback connection, this capacitor is very small (having a value measured in micromicrofarads) and serves merely to suppress oscillations. Such capacitors should not be confused with capacitor 26, which has a value measured in microfarads, and which serves as an essential part of the lead-lag compensation network. Of course, capacitor 26 also performs the oscillation-suppression function.

Figure 2:
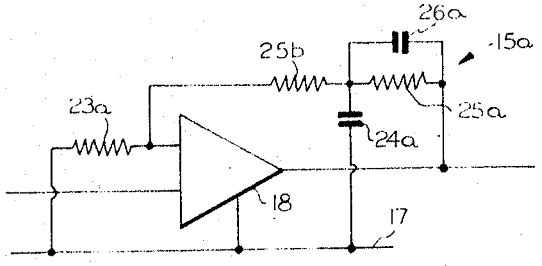
FIG. 2 is a schematic diagram showing a second version of the lead-lag network.

In the amplifying and compensating unit **15*a* shown in FIG. 2, the resistance in the minor feedback path is divided into two portions 25*a* and 25*b*, the lead capacitor 24*a* shunts portion 25*b* as well as the input resistor 23*a*, and the other capacitor 25*a* is connected across only resistor portion 25***a*. The advantage of this arrangement is that its capacitor 24*a* can be much smaller than the corresponding capacitor 24 in FIG. 1. For example, if it is assumed that the unit 15*a* of FIG. 2 has the same dynamic characteristics as unit 15, and that each of the resistor portions 25*a* and 25*b* has a value one-half of the value of resistor 25, the ratio of the size of capacitor 24 to the size of capacitor 24*a* will be at least 50:1 for an amplifier gain of 200. While this advantage is offset somewhat by the fact that capacitor 26*a* must be twice as large as capacitor 26 regardless of the gain, this is a minor drawback. On balance, the FIG. 2 arrangement is preferred.

Figure 3:
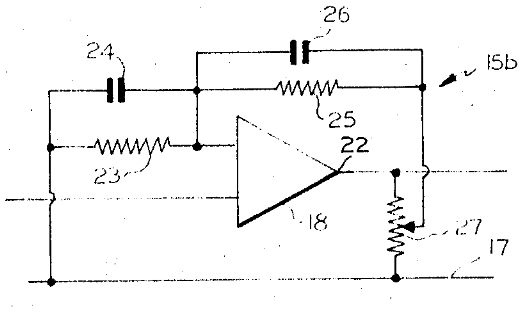
FIG. 3 is a schematic diagram showing an embodiment which affords a variable gain factor.

The amplifying and compensation unit 15*b* of FIG. 3 is the same as the unit 15 in FIG. 1, except for the inclusion of a voltage divider that allows a variable portion of the output voltage to be fed to the minor feedback path. The voltage divider is a potentiometer 27 having a resistance element connected between the output 22 and the common bus 17, and a wiper which is connected with the minor feedback path. The steady state gain of this unit is proportional to the ratio $R_{25}/XR_{23}$, where $R_{23}$ and $R_{25}$ are the values of resistors 23 and 25, respectively, and X is the proportion of the resistance element below the wiper. The gain can be varied by changing the position of the potentiometer wiper, but of course the range of variation is limited by the phase margin provided by the two R-C couples.

Although we have illustrated in FIG. 1 an electromechanical system in which unit 15 serves as a preamplifier, it will be understood that the combined amplifying and compensating units of this invention can be employed in purely electrical systems where they constitute the main amplifier, and wherein the main feedback signal is generated by exclusively electrical devices, such as solid state components, rather than a mechanical-to-electrical transducer. It should also be understood that, while the error signal produced by the summation network 14 can be applied to either the positive or the negative input of the operational amplifier, the arrangement shown in FIG. 1 is preferred because the impedance in the positive input channel is much higher. This characteristic tends to improve the linearity of the complete control system in which the improved circuit is used.

We claim:

1. In a negative feedback electrical control circuit including input (12) and feedback (13) signal generators, and a summation network (14) for combining said signals to produce an error signal, a combined amplification and lead-lag compensation device (15, 15*a* or 15*b*) which comprises (a) an operational amplifier (18) having positive (19) and negative (21) inputs and an output (22), and arranged to receive and amplify the error signal;

(b) a first resistance (23 or 23*a*) connected in a circuit with the negative input and shunted by a first capacitor (24 or 24*a*); and (c) a second resistance (25 or 25*a*, 25*b*) connected between the negative input and the output to provide a minor feedback path and at least a portion of which is shunted by a second capacitor (26 or 26*a*), (d) the resistances being sized to cause the amplifier to operate in the nonlinear mode.

2. The improved circuit defined in claim 1 wherein (a) the first capacitor (24) shunts only the first resistance (23); and (b) the second capacitor (26) is connected across the whole second resistance (25).

3. The improved circuit defined in claim 1 wherein (a) the second resistance comprises two portions (25*a* and 25*b*) connected in series;

(b) the first capacitor (24*a*) is connected across both the first resistance (23*a*) and that portion (25*b*) of the second resistance nearer the negative input end of the minor feedback path; and (c) the second capacitor (26*a*) shunts only that portion (25*a*) of the second resistance nearer the output end of the minor feedback path.

4. The improved circuit defined in claim 1 which includes an adjustable voltage divider (27) interposed in the connection between the output and the minor feedback path and arranged to supply to that path a variable portion of the output voltage.

5. The improved circuit defined in claim 4 in which the voltage divider comprises a potentiometer (27) having a resistance element connected between the output and a common bus, and a wiper connected with the minor feedback path.

References Cited

UNITED STATES PATENTS 3,378,739 4/1968 Livengood et al. ________ 318—18

ROY LAKE, Primary Examiner

JAMES B. MULLINS, Assistant Examiner

U.S. Cl. X.R.

307—230; 318—18; 328—155; 330—107, 108